United States Patent [19]

Quadri

[11] 4,149,267

[45] Apr. 10, 1979

[54] ASSOCIATIVE MEMORIES USING MAGNETIC BUBBLES

[75] Inventor: Farooq M. Quadri, San Diego, Calif.

[73] Assignee: Burroughs Corporation, Detroit, Mich.

[21] Appl. No.: 786,454

[22] Filed: Apr. 11, 1977

[51] Int. Cl.² ............................................. G11C 19/08
[52] U.S. Cl. ...................................... 365/12; 365/15; 365/41
[58] Field of Search ................................ 365/1, 12, 15

[56] References Cited

U.S. PATENT DOCUMENTS

| | | | |
|---|---|---|---|
| 3,760,390 | 9/1973 | Murakami | 365/1 |
| 4,070,659 | 1/1978 | Bullock | 365/12 |

Primary Examiner—James W. Moffitt
Attorney, Agent, or Firm—Joseph R. Dwyer; Mervyn L. Young; Kevin R. Peterson

[57] ABSTRACT

An associative magnetic domain memory comprising; a predetermined number of storage loops having a predetermined number of magnetic elements on which domains circulate, said domains or absence of said domains on said magnetic elements in said storage loops representing bits of binary information; write-in section and read-out means disposed relative to said storage loops; said write-in section including, generator for generating bits and propagating said bits to positions adjacent said storage loops as a set of bits with a subset of said bits representing address bits and the rest of said set being data bits, and a gate for transferring said set of bits into said storage loops for storage therein; said read-out section including a replicator for forming replicas of sets of bits in said storage loops, a gate for transferring said replica sets one at a time, a sensor for receiving and sensing said transferred replica sets if one of said address bits does not match the desired address criteria.

A plurality of similar memories are arranged in parallel with the replica address bits of each subset from each memory sensed as a row and an association performed on a plurality of address bit criteria. As before, the associative process will continue until there is a complete match of all the replica address bits with all the address criteria at which time the replica data associated with each of the replica address bits is read out.

10 Claims, 2 Drawing Figures

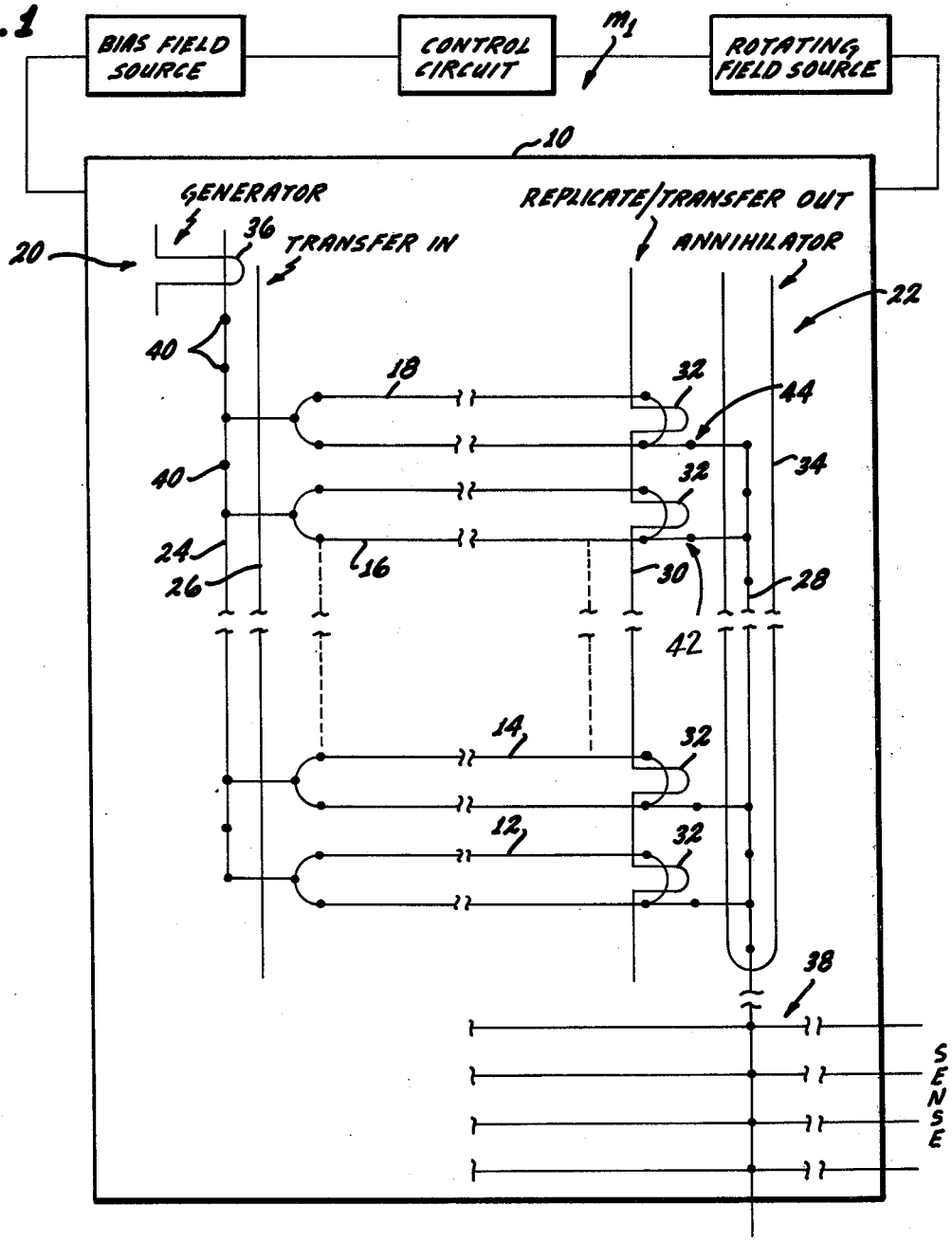
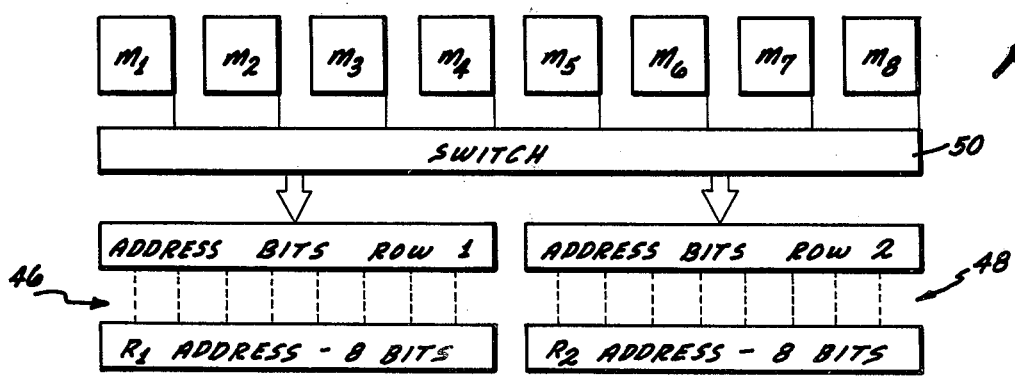

ASSOCIATIVE MEMORIES USING MAGNETIC BUBBLES

BACKGROUND OF THE INVENTION

The present invention relates to magnetic bubble memory devices with associative processing capabilities and particularly to an arrangement wherein storage loop organizations provide reduced access time to data stored in the storage loops.

One of the concerns in the development of associative magnetic domain memories is the reduction in access time to data (bubbles and voids) stored in memory. A number of prior art devices attempting to impart associative capability to magnetic bubble domain memories utilizes the techniques of either interaction of bubble domains with current carrying conductors or interaction between two bubble domains to achieve the objective e.g. U.S. Pat. Nos. 3,761,886 and 3,760,390. Since these techniques require interaction with stored data itself, it is felt that the reliability has something to be desired. Moreover, the time required for association was long enough to be prohibitive. In a large association memory the access time for search of each block and time required for decision becomes very important. Further, a number of prior art devices have a magnetic domain memory utilizing a plurality of minor loops which are accessed through a major loop. When accessed to the stored data is desired, the bits comprising the data are transferred serially from the minor loops to the major loops and serially transferred to the sensor to be read.

Various other techniques are utilized for transferring data to and from one or more circulating minor storage loops all with a view towards reducing access time to the stored data. One prior art device shown in U.S. Pat. No. 3,971,005, though not an associative memory, utilizes a plurality of unconnected minor loops in which a writing circuit is located on one side of the loops and a read-out circuit is located on the other side of the loops to reduce access time necessary for the data bits to circulate completely around the loops before being accessed. It is also necessary in this technique to load the data back into the storage loops. Another technique disclosed in U.S. Pat. No. 3,838,407, though not an associative memory, is to use a bubble memory in which the read-in and read-out of data from a plurality of minor loops occurs at several locations in the loops thus reducing access time still further.

Nonetheless, a number of short comings, in addition to the above, have been observed in the prior art. First, the information once transferred from the minor loops to the major loop before transfer back into the minor loop. Further, the prior art devices required controllers to track the position of the circulating data in the minor loops since the location of the bubble in the minor loop with respect to its exit point to the major loop must be known to track the position of the data in the minor loops. Such controllers require current carrying conductors to perform such operations and these techniques were non-reliable and also required multiple sensor points.

It is, therefore, a primary object of this invention to provide a magnetic bubble memory device with associative processing capabilities and having an arrangement of storage loop organizations which provide reduced access time to the data stored in the storage loops and to utilize existing technology in such an arrangement, already found to be reliable. It is still another object to provide a bubble memory with associative processing capabilities utilizing the memory device itself to provide such capabilities.

SUMMARY OF THE INVENTION

According to the present invention, the associative magnetic domain memory comprises a plurality of storage loops with certain of said storage loops containing address bits (bits being domains or voids) to identify blocks or sets of data bits stored in other storage loops. All storage loops are transposed between a write-in means comprising a means for generating bits and propagating said bits to positions adjacent said storage loops, and gate means for transferring said bits into said storage loops simultaneously, and also between a read-out means comprising a replicator/transfer out gate means, an output means including an annihilator and a sensor. When access to the stored data bits is desired, the set of data bits in the storage loops nearest the read-out means is replicated and the replica bits are transferred to the output means where the replica address bits are transferred to the sensor. The first of the replica address bits is detected by the sensor and compared with an address criteria and if there is no match between the address criteria and the first of the replica address bits, the annihilator is activated and the remaining replica data bits on the output means are destroyed. A new data set is ready to be replicated and its replica compared with the address. If at any time a match is found between the replica address bits and the address, the annihilator will not be activated and all the replica data bits following the replica address bits are read out.

In the embodiment disclosed a plurality (n) of such magnetic domain memories are formed in a multichip package and operated in parallel with a similarly numbered replica address bit being transferred, in rows, to their respective sensors and the signal represented by the replica address bits are associated, in parallel, in a comparator. This process of association of the replica address bit signals with the requested address criteria in the comparator will continue until both the signals of first row of the replica address bits to be sensed and the signals of at least a second row of the replica address bits signals match the requested address criteria at which time all of the replica data which follow the replica address bits will be read out. Thus, for example, with two adess loops in each memory, there are two bits of replica address signals eminating from each sensor which results in 2n bits of information read in only two cycles. Thus, with 2n bits $2^{2n}$ blocks of information can be addressed in each multichip package.

BRIEF DESCRIPTION OF THE DRAWINGS

FIG. 1 is a plan view of a magnetic domain memory arranged for associative processing in accordance with the teachings of this invention, and FIG. 2 is a plan view of an associative memory utilizing eight (n) domain memory organizations of the type depicted in FIG. 1 for a complete multichip memory system with associative processing capabilities.

DESCRIPTION OF THE PREFERRED EMBODIMENT

Referring now to the drawings and first to FIG. 1, it can be seen that there is disclosed a single bubble memory organization $M_1$ on which conditions exist for establishing single wall domains on suitable magnetic material such as an epitaxial magnetic garnet film on a nonmagnetic garnet substrate 10; all of which are well-known in the art. Patterns of magnetically soft overlay material forming a T-bar propagate elements are commonly employed in these organizations, however, other propagate elements such as half disk or contiguous disk patterns may be used.

A series of identical storage, or sometimes called minor, loops, formed of the selected type propagate elements (four shown and identified as 12, 14, 16 and 18) are stacked, or aligned, vertically, as shown in the drawings, with their respective minor axes located adjacent to parallely disposed Write-in means 20 and Read-out means 22.

Write-in means 20 comprises an input track 24 and a transfer-in gate 26 and the read-out means 22 comprises an output track 28 and a replicator/transfer-out gate 30; one replicator 32 for each storage loop. Output track 28 is part of an annihilator 34. Although only four storage loops are illustrated, the dotted lines illustrated between the storage loops indicate that additional storage loops maybe utilized and each loop closes on itself so that circulating bubbles established in a loop, in time, circulate indefinitely in response to a rotating in-plane magnetic field unless transferred out as for rewriting different information into the memory.

Also, suitable bias sources, control circuits including auxilliary circuits such as pulsing circuits for the application of pulses to the generator, the transfer gates and annihilators are well-known and are shown herein only by block diagrams.

Located at the entrance to the input track 24 is a generator 36 which generates bubble domains to be transferred serially along the input track 24. Again, a bubble, or the absence of a bubble (a void) represents a binary "1" bit and a binary "0" bit and there is 1 bit position for each storage loop on the track 24. In the embodiment disclosed, the first two such bits from the generator 36 and transferred along the track 24 represents address, or tag, bits and these address bits will be transferred into the first or lower two storage loops 12 and 14 (known as address bit loops). All other bits following the first two and transferred along the transfer-in track represent data bits and their storage loops are known as data bit loops. When the first two address bits, whether domain or voids, reach their respective positions opposite the entrance to the first two storage loops 12 and 14, a transferinpulse on gate 26 will transfer the bits in parallel into all the storage loops. Thus, circulating in the storage loops are sets or blocks of bits identifiable or addressable by a subset of bits known as address bits having known data bits therewith and representing a stored binary information. Again, the number of data bits and address bits can be varied, as desired, depending upon the needs of the user.

When it is desired to read data from the memory, one set of bits is first transferred out by the combined replicate/transfer-out gate 30 and 32 which allow the first portion of the replicated bits to remain in their respective storage loops and which transfers the other portions of the replicated bits into the output track 28. Thus, a replica set of bits is transferred out while the original set remains in the storage loops and is continuously circulated and, in this way, the information is not destroyed in the memory. Thereafter, successive pulses transfers the data along the output track 28 to a sensor 38 which translates the bits into electrical signals representing binary "1's" or binary "0's".

There are certain things about this memory which should be noted at this time. The input track 24 is provided with additional propagate elements, such as 40, which represent additional bit positions in order to allow for the spacing between the storage loops since a bubble cannot be propagated too great a distance between elements. On the side of the Read-out means 22 there are two bit positions between the replicate/transfer-out gate 30, 32 and the output track 28, as at 42 and 44 representing two pulse positions away from the annihilator 34 so that there is no interaction with the data inside the annihilator and that inside the storage loops. Also, it should be evident that, there is a magnetic element for each bit position in each storage loop.

Turning now to FIG. 2 which shows, as an example, the associative memory arrangement utilizing eight memory devices M1-M8, (n=8) operable in parallel, each of a type disclosed in FIG. 1, including the sensors 38, connected to two eight bit comparators 46 and 48. Rows of address bit signals from each replica set of bits from the eight memories and connected in parallel, are sent to the comparators; the first row of replica address bits from the first storage loops 12 entering the comparator 46 are compared to an address in the first eight bit register R-1. If there is no match, the annihilators 34 of all eight memories are pulsed or activated and the data destroyed; there being no need to proceed further with another association process. Note again that the original bubble representing original sets of bits remained in their respective storage loops and are circulating during this association processing. On the next cycle, the replicator/transfer-out gate 30 and 32 is pulsed and the next replica set of bits of each of the memories ultimately enter the output track 28 in parallel with the first replica address bit signal of each member again transferred ultimately to the comparator 46. If, in this case, for example, there is an association, then the second row of eight replica address bit signals are transferred (switched by switch 50) to the second comparator 48 and an association performed with the address in the second register R-2. If there is no association, the annihilators 34 are again pulsed and the bits in all the annihilators are eliminated, as before. Thereafter, as before, the replicator/transfer-out gates 30, 32 are again pulsed and the first row of replica address bit signals are again compared in the first comparator 46 and if there is a match, the second row of replica address bit signals are transferred to the second comparator 48 through switch 50. The aforementioned procedure continues until there is an association for both rows of replica address bit signals emanating from the eight memories.

Thus, it can be seen that with 16 address bits only a few pulses are needed for an association and thus a large memory address can be utilized. For example, two rows of bits at 16 bit positions is 32K ($n^{16}$) blocks of data that can be addressed in each package. From the foregoing, and again, with particular reference to FIG. 1, it can be seen that the number of pulses required for access, or bit delays between successive searches, depend upon the number of bit positions between the bit position representing the first address bit of a set in the output track 28 and the sensor plus two bit positions between the replicator/transfer-out gate 30, 32 and the output track 28 as exemplified by the bit positions shown at 42 and 44. Further, in order to prevent an overlap or a duplication in the transfer of the sets out of the storage loops, the number of bit positions in each of the storage loops should be a prime number not divisible by the number of bit positions between the storage loop and the sensor.

Finally, it should be pointed out that, if it is desired to rewrite, i.e., replace a set, data and address bits, in the storage loops, this is accomplished by simply pulsing the transfer-out gate 30 without pulsing the replicator 32 as a new set written in at the appropriate time in the Write-in means 20 in the manner discussed above.

I claim:

1. An associative magnetic domain memory comprising:
    a domain propagation structure including magnetic elements disposed in an arrangement on which magnetic domains propagate in response to a rotating in-plane magnetic field;
    the arrangement including a predetermined number of storage loops having a predetermined number of magnetic elements on which said domains circulate, said domains or absence of said domains on said magnetic elements in said storage loops representing bits of binary information;
    write-in means and read-out means disposed relative to said storage loops; and
    said write-in means including, means for generating bits and propagating said bits to positions adjacent said storage loops, one bit for each storage loop as a set of bits with a subset of said bits representing an address and the rest of said set being data bits, and means for transferring said set of bits into said storage loops for storage therein;
    said read-out means including means for forming replicas of sets of bits in said storage loops, means for transferring said replica sets one at a time, means for receiving and sensing said transferred replica sets, and means for annihilating said transferred replica sets if said address does not match the desired address criteria so that successive replica sets of bits may be formed and transferred without waiting until the data bits of the unmatched address are serially transferred out of the read-out means.

2. The associative magnetic domain memory as claimed in claim 1 wherein said sets of bits circulate in parallel columns in said storage loops.

3. The associative magnetic domain memory as claimed in claim 1 wherein said storage loops are arranged in a column with said write-in means disposed on one side of said column and said read-out means disposed on the other side of said column.

4. The associative magnetic domain memory as claimed in claim 1 wherein said address subset comprises at least two bits circulating respectively in two storage loops, said storage loops containing said address subsets being located nearest said sensing means.

5. The associative magnetic domain memory as claimed in claim 1 wherein each set of replica bits transferred to said replica set receiving means is propagated therefrom in such a manner that said address subset is sensed before said data bits are sensed.

6. The associative magnetic domain memory as claimed in claim 1 wherein said sensing means for sensing transferred replica bits comprises means for converting said bits into electrical signals as said bits are transferred out from said transferred replica set receiving means.

7. The associative magnetic domain memory as claimed in claim 6 where further including comparator means for comparing a first signal from said sensor means and then for comparing a second signal from said sensor means only if said first signal matches the desired address criteria.

8. The associative magnetic domain memory as claimed in claim 1 wherein said storage loops are arranged in a plurality of columns with said write-in means disposed on one side of each of said columns and said read-out means disposed on the other side of each of said columns and whereas each replica set from each column is propagated in series in each replica set receiving means but in rows from the plurality of read-out means.

9. An associative magnetic domain memory comprising:
    a domain propagation structure including magnetic propagation elements disposed in an arrangement on which magnetic domains propagate in response to a rotating in-plane magnetic field,
    the arrangement including a plurality of closed loops of equal domain capacity,
    write-in means and read-out means disposed respectively on each side of the closed loops having a domain capacity to accomodate the predetermined number of loops,
    said write-in means including a first track and means for generating domains thereon for propagation along said first track and a transfer-in gate connecting each loop to said first track for transferring said domains into said loops in parallel,
    said read-out means including a replicator and transfer-out gate means for replicating said domains transferred out of said loops by said transfer-out gate means and a second track for receiving and propagating said replicated domains, said second track and said replicator/transfer-out gate means being connected in parallel,
    sensor means for receiving and converting said replicated domains into electrical signals as transferred out serially from said second track means,
    selected closed loops nearest the sensor means and the domains therein being the domains forming an address so that the replicated domains from said selected closed loops reach said sensor means before the replicated domains of the remainder of said loops reach said sensor means,
    comparator means containing a desired address for comparing said signals received from said sensor means, and means for annihilating said replicated domains on said second track if said signals do not match the desired address.

10. An associative magnetic domain memory comprising:
    a domain propagation structure including magnetic elements disposed in arrangements on which magnetic domains propagate in response to a rotating in-plane magnetic field;
    the arrangements including a predetermined number of storage loops in columns having a predetermined number of magnetic elements on which said domains circulate, said domains or absence of said domains on said magnetic elements in said storage loops representing bits of binary information;
    write-in means and read-out means disposed relative to said columns of storage loops;
    said write-in means including, means for generating bits and propagating said bits to positions adjacent to said column of storage loops, one bit for each storage loop in each column as a set of bits with a subset of said bits representing an address and the rest of said set being data bits, and means for transferring said set of bits into said column of storage loops for storage therein;

said read-out means including means for forming replicas of sets of bits in each of and column of said storage loops, means for transferring said replica sets on at a time with the subset of bits representing the address being the first to be transferred, means for receiving and sensing said transferred replica sets, and means for annihilating said transferred replica sets if said address does not match the desired address criteria.

* * * * *